United States Patent [19]

Eigenstetter et al.

[11] Patent Number: 4,703,185
[45] Date of Patent: Oct. 27, 1987

[54] ARRANGEMENT FOR OPTICAL IMAGING OF TWO SUBJECTS LOCATED IN DIFFERENT OBJECT PLANES

[75] Inventors: Herbert Eigenstetter, Planegg; Peter Mengel, Eichenau, both of Fed. Rep. of Germany

[73] Assignee: Siemens Aktiengesellschaft, Berlin and Munich, Fed. Rep. of Germany

[21] Appl. No.: 798,411

[22] Filed: Nov. 15, 1985

[30] Foreign Application Priority Data

Dec. 20, 1984 [DE] Fed. Rep. of Germany ....... 3446584

[51] Int. Cl.$^4$ ............................................. G01N 21/86
[52] U.S. Cl. ...................................... 250/548; 250/571
[58] Field of Search ................ 250/201, 548, 204, 571

[56] References Cited

U.S. PATENT DOCUMENTS

| 4,253,112 | 2/1981 | Dömens | 358/101 |
| 4,616,130 | 10/1986 | Omata | 250/201 |

OTHER PUBLICATIONS

Domens et al., "Automatic Mask Alignment for X-ray Microlithography", Siemens Research and Development Reports, vol. 13, No. 2, 1984, pp. 43–47.

Primary Examiner—Gene Wan
Attorney, Agent, or Firm—Hill, Van Santen, Steadman & Simpson

[57] ABSTRACT

In the optical imaging of two subjects located in different object planes, at least one objective should be capable of being displaced for focusing relative to the object planes, being displaceable absolutely in a shift-free manner and with a very high positioning reproducibility. To this end, a positioning drive, particularly a piezo positioning drive, effects movement at a housing section which is displaceable relative to the object planes and at least carries the objective, whereby the displaceable housing section must be connected to the remaining, stationarily situated housing via resilient connections which are formed by elastically deformable weak points of the housing. Apparatus fashioned in such a manner are employed particularly for automatic mask adjustment in the transfer of structures in the sub micrometer range on the semiconductor wafers by way of x-ray lithography.

19 Claims, 3 Drawing Figures

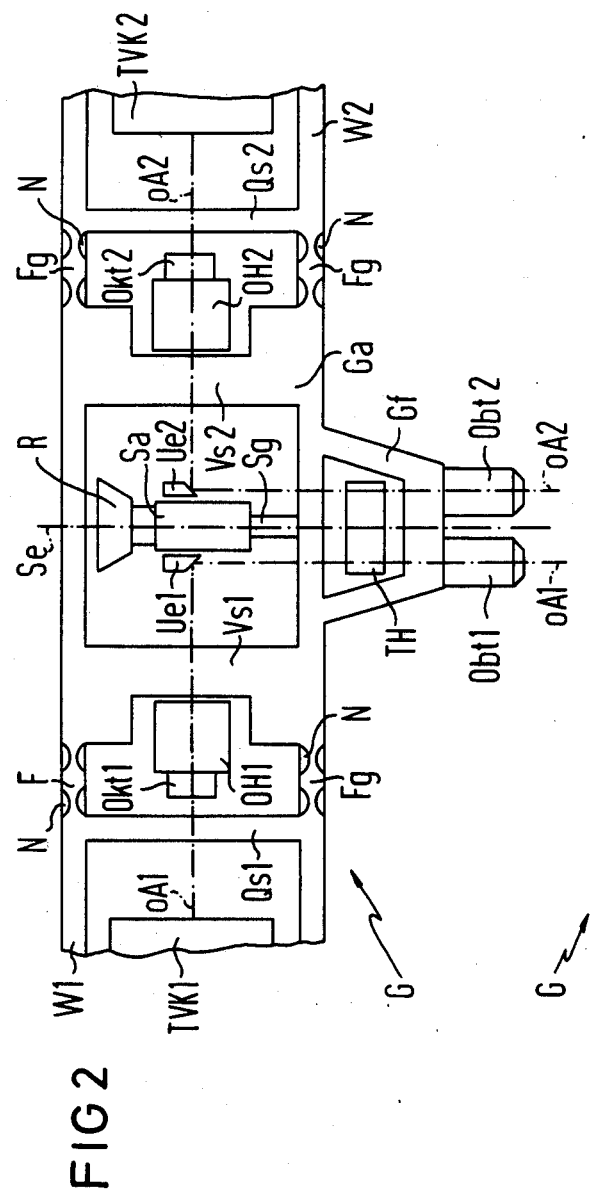

ARRANGEMENT FOR OPTICAL IMAGING OF TWO SUBJECTS LOCATED IN DIFFERENT OBJECT PLANES

BACKGROUND OF THE INVENTION

1. Field of the Invention

The present invention relates to an arrangement for optical imaging of two subjects located in different object planes onto an optical sensor wherein at least one objective is adjustable relative to the object planes with the assistance of a positioning drive.

2. Description of the Prior Art

In semiconductor technology, superfine structures are transferred onto semiconductor wafers with the assistance of masks, whereby a highly accurate adjustment of the mask relative to the wafer is required. Therefore, for example, the transfer of structures in the sub-micrometer range by means of x-ray lithography requires an adjustment of a mask relative to the wafer with accuracies in the region of below 0.1 $\mu$m.

The German Pat. No. 28 22 269 discloses a method for automatic mask adjustment in which the adjustment of successive masks is respectively undertaken with adjustment structures extending orthogonally relative to one another on the semiconductor wafer coated with a photoresist and on the mask. The adjustment structure of the semiconductor wafer is already generated, for example by etching, on the surface of the semiconductor wafer in a first structuring operation, so that the adjustment structures present on the corresponding mask can be aligned with reference to this first adjustment structure in all following structuring operations. For automatic mask adjustment, the adjustment structures on the mask and on the wafer are then scanned with the assistance of an optical sensor in directions extending parallel to their edges, whereupon the intensity of the picture signals generated by the opto-electronic scanning is integrated up line-by-line, or in line sections, and the analog integral values resulting therefrom are converted into digital grey levels and are stored. By forming the difference of the grey levels of successive lines and further evaluation of the resulting difference signals, the position of the middle axis of the adjustment structures can then be acquired, whereupon the semiconductor and the mask are then displaced and turned relative to one another in accordance with the identified offset of the center lines.

In the known mask adjustment on the basis of pattern recognition and image processing at suitable adjustment structures, however, the proximity spacing between the masks and the semiconductor wafer limits the obtainable recognition and adjustment precision. For example, when in a microscopic imaging the focus plane is placed between the mask plane and the wafer plane, then the adjustment structures of both planes are only reproduced in an unsharp manner on the optical sensor. The evaluation of the opto-electronic edge signals which are thereby spread is then not unequivocal for the identification of the relative portion of the mask and the semiconductor wafer, i.e. the accuracy of the position recognition is limited.

In a known apparatus for optical imaging of the adjustment structures of the mask and the semiconductor wafer onto an optical sensor, a two-plane optics is employed wherein either the mask plane or the wafer plane can be sharply imaged onto the optical sensor by two different optical path lengths in the beam path of the imaging optics. Fluctuations in the proximity distance of the mask and the semiconductor wafer, irregularities of the wafer surface and different thicknesses of the photoresist on the wafer surface, however, also lead here to a deterioration of the sharpness of the image of the edge transitions in the individual objective planes. In contrast thereto, the limits of opto-electronic grey scale value image processing can only be achieved when, in the image acquisition, the adjustment structures of the mask and the semiconductor wafer are imaged on the optic sensor with unequivocal sharpness.

The periodical "Siemens Forschungs-und Entwicklungsberichte", Vol. 13, No. 2, 1984, pp. 43–47 already addresses the problems which occur in automatic mask adjustment for x-ray lithography due to fluctuations in the proximity distance of the mask and wafer. These problems should thereby be resolved in that an illumination aperture which is small in comparison to the objective aperture is employed for the optical imaging of the adjustment structure. In accordance with an alternative proposed solution, the objective should be adjusted with the assistance of a piezo-positioning drive such that, first of all, the adjustment structure of the mask and, secondly, the adjustment structure of the semiconductor wafer, are sharply imaged on the optical sensor. It is thereby of decisive significance, however, that the objective must be capable of being adjusted absolutely free of shift.

SUMMARY OF THE INVENTION

The object of the present invention, therefore, is to provide an arrangement for optical imaging of two subjects located in different object planes onto an optical sensor wherein, for focusing, at least one objective can be displaced absolutely shift-free relative to the object planes with the assistance of a positioning drive and can be displaced with a very high positioning reproducability.

Given an apparatus of the type set forth above, the object is achieved, according to the present invention, in that the positioning drive is effective at a housing section adjustable relative to the object planes and carrying at least the objective and in that the adjustable housing section is connected to the remaining, stationarily located housing via resilient connections which are formed by elastically-deformable weak points of the housing.

The present invention is based on the perception that an absolutely shift-free displacement of the objective can only be achieved with the required, high positioning reproducability, when the objective is displaced together with the housing section in or to which it is rigidly secured. An essential prerequisite, therefore, is that the resilient connections required for the adjustability of the housing section are formed by elastically deformable weak points of the housing, i.e. that the displaceable housing section must be connected of one piece to the remaining, stationarily located housing via the resilient connections. Only by way of such one-piece formation of the resilient connections from the housing can identical properties of all resilient connections be guaranteed.

In accordance with a particularly preferred embodiment of the invention, at least four resilient connections are provided and are located in pairs at opposite sides of the adjustable housing section. As a result of such pairwise provision of at least four resilient connections, the required, shift-free adjustment of the adjustable housing section can be realized in a particularly simple manner.

It is also particularly advantageous when each resilient connection is formed by two weak points spaced at a distance from one another, whereby each weak point is formed by grooves introduced into the wall of the housing at opposite sides. As a result of being able to introduce the grooves into the wall of the housing with extremely high accuracy, the spring links and the effective cross-sections of the resilient connections can be prescribed with correspondingly high accuracy, this leading to a high reproducibility of the force/path behavior of the adjustable housing section. The grooves preferably comprise a hemispherical cross section since an undesired concentration of topical flexural stresses is avoided by way of this cross-sectional shape.

In accordance with a further feature of the invention, parting slots which respectively extend between two spring joints are introduced between the adjustable housing section and the remaining housing. The introduction of such parting slots enables the mobility of the adjustable housing section in a particularly simple manner.

The positioning drive which attacks the adjustable housing section is preferably supported at the remaining housing. A particularly simple arrangement of the positioning drive and compact design of the overall apparatus is then enabled in that the positioning drive is located in the adjustable housing section and is supported at a rib of the remaining housing, the rib projecting into the adjustable housing section.

It has turned out to be of particular advantage for adjustment paths of the adjustable housing section in the sub-micrometer range when a piezo positioning drive is provided as the positioning drive. Given such piezo positioning drives, for example, an adjustment voltage of 1 V can have an adjustment path of 1/100, $\mu$m allocated thereto.

In accordance with a preferred, further embodiment of the invention, an objective having infinite image distance is provided which is followed by a barrel lens carried by the stationarily located housing. The advantage of employing an objective having infinite image distance lies in the parallel beam path between the objective and the barrel lens. In particular, the overall magnification of the apparatus is not changed due to an adjustment of the objective.

Finally, it is particularly beneficial for the automatic mask adjustment when the subjects in two spatially separate fields of view can be imaged onto two optical sensors via two objectives, whereby the positioning drive attacks centrally between the optical axes, attacking at the adjustable housing section which carries both objectives. Since the mask adjustment requires both translational as well as rotary positioning movements, the division into two fields of view located at a distance from one another yields considerable advantages. Furthermore, the positioning drive can then be located between the optical axes of the two objectives in a simple manner such that a particularly compact structure derives for the overall apparatus.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 2 is a front view of an apparatus for optical imaging of the adjustment structures of the mask and the semiconductor wafer onto an optical sensor; and FIG. 3 is a plan view of the apparatus of FIG. 2.

DESCRIPTION OF THE PREFERRED EMBODIMENTS

Figure 1:
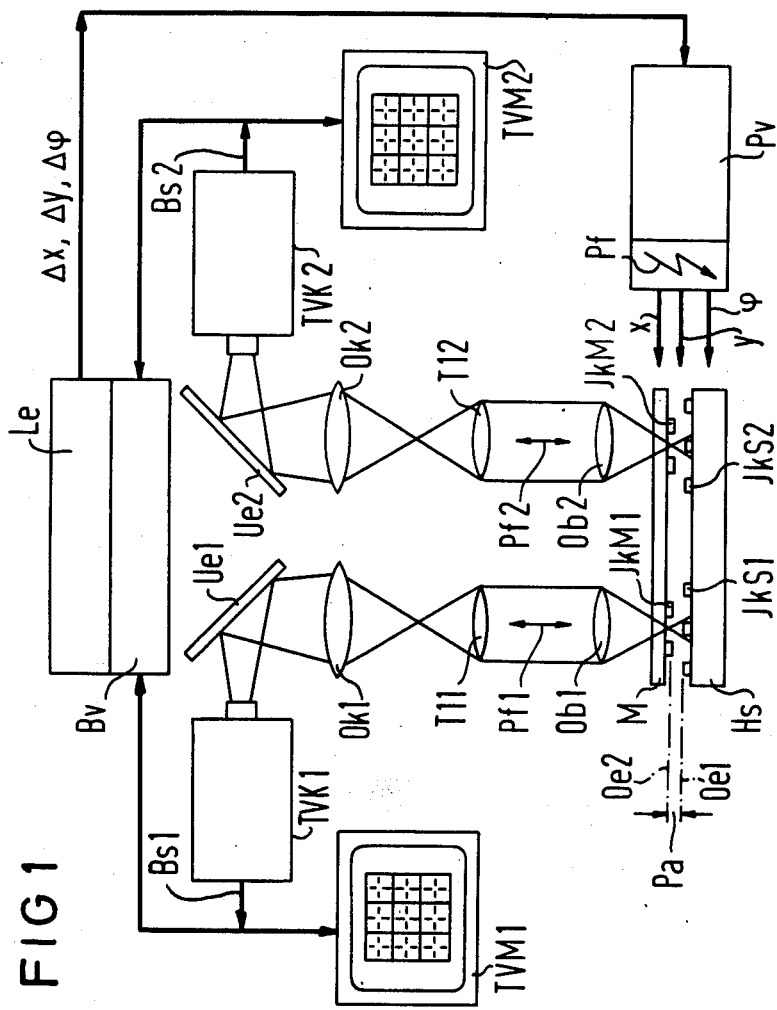
FIG. 1 is a schematic diagram illustrating the fundamental operation of the mask adjustment in accordance with the present invention.

FIG. 1 illustrates a semiconductor wafer Hs on which superfine structures in the sub-micrometer range are to be transferred by x-ray lithography. The masks M required for these structure transfers must be adjusted relative to the semiconductor wafer Hs with accuracies in the range below 0.1 $\mu$m, whereby such a precise adjustment can no longer be undertaken visually, but only automatically. For the mutual alignment of the mask M relative to the semiconductor waver Hs, adjustment structures extending orthogonally relative to one another are provided which are applied to two locations arranged at a distance from one another on the mask M and on the semiconductor wafer Hs and which, in the case illustrated, are fashioned as adjustment crosses. The adjustment crosses applied to the semiconductor wafer Hs are referenced JkS1 and JkS2, whereas the assigned adjustment crosses on the mask M are referenced JkM1 and JkM2. In order to avoid damage to the masks, a distance exists between the semiconductor wafer Hs and the mask M, i.e. the adjustment crosses JkS1 and JkS2 are located in a first object plane Oe1, whereas the adjustment crosses JkM1 and JkM2 are located in a second object plane Oe2. The distance between the object planes Oe1 and Oe2, which is referred to as the proximity distance Pa, can be subject to fluctuations, whereby these fluctuations, for example, range between 30 $\mu$m and 50 $\mu$m.

The adjustment crosses JkS1 and JkM1 are scanned in directions extending parallel to their edges, being scanned with the assistance of an optical sensor which, in the illustrated case, is fashioned as a TV camera TVK1 with an electronic image rotation by 90°. The picture signals Bs1 generated by the opto-electronic scanning are then supplied to a TV monitor, on the one hand, and, on the other hand, to an image processing device Bv.

The optical imaging of the adjustment crosses JkS1 and JkM1 onto the TV camera TVK1 occurs by way of an objective Ob1 having infinite image distance, a barrel lens T11, an ocular Ok1 and a deflection element Ue1 illustrated as a path-folding mirror, whereby the optical components mentioned above are disposed in succession in the beam path.

The adjustment crosses JkS2 and JkM2 are scanned in directions extending parallel to their edges, being scanned with the assistance of an optical sensor which, in the illustrated case, is fashioned as a TV camera TVK2 having an optical image rotation by 90°. The picture signals Bs2 generated by the opto-electronic scanning are then supplied, on the one hand, to a TV monitor TVM2 and, on the other hand, to the aforementioned image processing device Bv.

The optical imaging of the adjustment crosses JkS2 and JkM2 onto the TV camera TVK2 occurs with an objective Ob2 having infinite image distance, a barrel lens T12, an occular lens Ok2 and a deflection element Ue2, also shown as a path-folding mirror, whereby the optical components mentioned are located in succession in the beam path.

The intensity of the picture signals Bs1 or, respectively, Bs2 generated by the opto-electronic scanning are integrated up in the image processing device Bv line-by-line, or in line groups, whereupon the resulting, analog integral values are converted into digital grey levels and are stored. The difference formation of the grey levels of successive lines and further evaluation of the resulting difference signals can then be employed to acquire the position of the center axis of the adjustment crosses JkS1 and JkM1 or, respectively, JkS2 and JkM2 in a position recognition device Le, whereupon the semiconductor wafer Hs and the mask M are then displaced relative to one another and rotated in accordance with the identified offset of the center line. To this end, the adjustment variables $\Delta x$, $\Delta y$ and $\Delta \phi$ are formed by the position recognition device Le as positioning signals and are supplied to a piezo positioner Pv (schematically illustrated) which effects the dislocation in two directions perpendicular to one another in accordance with the arrows x and y and effects the rotation in accordance with the arrow $\phi$. The arrow Pf indicates that the individual piezo positioning drives of the piezo positioner Pv are driven by a high voltage of, for example, 1000 V.

Further details regarding the above-described, automatic mask adjustment on the basis of pattern recognition and picture processing with reference to suitable adjustment structures proceed from the German Pat. No. 28 22 269 and from the periodical "Siemens Forschungs- und Entwicklungsberichte", Vol. 13, No. 2, 1984, pp. 43-47, both fully incorporated herein by this reference.

In the known mask adjustment, the proximity distance Pa between the mask M and the semiconductor wafer Hs limits the obtainable recognition and adjustment accuracy insofar as additional measures in the image acquisition do not succeed in imaging the adjustment structures of the mask M and the semiconductor wafer Hs onto the TV cameras TVK1 and TVK2 with unequivocal focus. This is intended to be achieved by way of a continuous refocusing of the image contents of the mask M and the semiconductor wafer Hs. To this end, a piezo-controlled, shift-free adjustment of the object lenses Ob1 or, respectively, Ob2 for the continuous setting of the sharpness of the adjustment structures on the mask M and on the semiconductor wafer Hs in the two spatially separated fields of view is provided, whereby the adjustability of the object lenses Ob1 and Ob2 relative to the object planes Oe1 and Oe2 in FIG. 1 is only schematically indicated by the double arrows Pf1 or, respectively, Pf2. An auto focus can then be realized by software evaluation of the integrated edges signals of the mask M1 and the semiconductor wafer Hs. The sharpness plane thereby occurs from the maximization of local correlation functions at the edge transition. In particular, the positioning drive provided for the objective lens displacement can be automatically set to the optimum sharpness plane of the mask M or, respectively, the semiconductor wafer Hs.

FIGS. 2 and 3 illustrate the structural execution of an apparatus for optical imaging of the adjustment structures of the mask and the semiconductor wafer onto an optical sensor in a front view or, respectively, in a plan view. Except for a few, slight modifications, the illustrated structural execution is thereby based on the fundamental manner of operation set forth with respect to the apparatus of FIG. 1.

The housing of the apparatus, referenced G, overall and stationarily located, is constructed in a mirror-symmetrical manner relative to a plane of symmetry Se, whereby the division into the two spatially separated fields of view is taken into consideration by the symmetry. The upper, horizontally-directed wall W1 of the housing G is connected to a lower wall W2 which is directed parallel thereto, being connected thereto via vertical cross webs Qs1 or, respectively, Qs2 which are equidistant from the plane of symmetry Se. An adjustable housing section referenced Ga overall extends between these cross webs Qs1 and Qs2, this adjustable housing section being connected to the remaining, stationarily arranged housing G by way of four resilient connections Fg located in pairs at opposite sides. The adjustability of this adjustable housing section Ga relative to the remaining, stationarily located housing G is enabled by two parting slots Ts which are introduced into the upper wall W1 and, respectively, the lower wall W2 and which extend between the corresponding resilient connections Fg. Each of the four spring or resilient connections Sg is formed by two weak points located at a distance from one another, whereby each of these weak points is formed by two grooves N comprising an hemispherical cross section. The adjustable housing section Ga therefore remains integrally connected to the remaining, stationarily located housing G via the four spring connections Fg. As may be seen from FIG. 3, the adjustable housing section Ga takes up only a portion of the depth of the housing G. Moreover, rigidly-executed reinforcing webs Vs1 and Vs2 which are again equidistant from the plane of symmetry Se extend in the region of the adjustable housing section Ga, these extending between the upper wall W1 and the lower wall W2.

A housing continuation Gf in the form of a trapezoid, an inwardly hollow, is applied to the underside of the adjustable housing section Ga, this underside of the housing continuation Gf carrying a first objective lens tube Obt1 and an objective lens tube Obt2 equidistance from the plane of symmetry. The objective lens Ob1 illustrated in FIG. 1 or, respectively, a corresponding lens system, is located in the objective on tube Obt1, whereas the objective lens Ob2 shown in FIG. 1 or, respectively, corresponding lens system, is located in the objective lens tube Obt2. The barrel lenses T11 and T12 as shown in FIG. 1 are located in a common barrel lens mount TH which projects into the cavity of the housing continuation Gf and is anchored in an identically-designed housing continuation of the remaining, stationarily located housing G, this housing continuation being separated by the parting slot Ts. Deviating from the fundamental manner of operation shown in FIG. 1, the deflection elements Ue1 and Ue2 in the construction illustrated in FIG. 2 are not located between the occular elements Ok1 or, respectively, Ok2 and the TV cameras TVK1 or, respectively, TVK2, but are located between the barrel lenses T11 or, respectively, T12 and the occulars Ok1 or, respectively, Ok2. The deflection devices Ue1 and Ue2, fashioned as prisms, are anchored in the stationary housing G and project into the adjustable housing section Ga in the region between the reinforcing ribs Vs1 and Vs2. The optical axes Oa1 and Oa2 assigned to the two fields of view and first extending vertically, assume a horizontal course following the deflection devices Ue1 and, respectively, Ue2. Located following the deflection devices Ue1 and, respectively, Ue2 are the occulars or lens systems corresponding to the occulars Ok1 or, respectively, Ok2 (cf. FIG. 1), these being held in an occular tube Okt1 or, respectively, in an occular tube Okt2. The occular tube Okt1 is thereby secured in an occular tube mount OH1 located between the cross web Qs1 and the reinforcing web Vs1 and anchored in the stationary housing G, whereas the occular tubes Okt2 is secured in a corresponding manner in an occular tube mount OH2 located between the cross web Qs2 and the reinforcing web Vs2 and anchored in the stationary housing G. In the further course of the horizontal segments of the optical axes oA1 or, respectively, oA2, the TV cameras TVK1 or, respectively, TVK2 are then located following the cross webs Qs1 or, respectively, Qs2, the TV cameras being rigidly connected to the stationary housing G, but in an adjustable manner relative to the optical axes oA1 or, respectively, oA2.

The shift-free adjustment of the objectives Ob1 and Ob2 (cf. FIG. 1) in the vertical direction of the optical axes oA1 or, respectively, oA2, to the respective optimum sharpness plane occurs with the assistance of the positioning drive Sa designed as a piezo positioning drive which attacks the adjustable housing section Ga and is supported at the stationary housing G. In order to obtain as compact a structure as possible, the positioning drive Sa is located in the adjustable housing section Ga precisely between the deflection devices Ue1 and Ue2 and is supported against a very stiffly designed rib R of the remaining, stationary housing G, which rib projects into the adjustable housing section Ga. The positioning drive Sa is thereby rigidly screwed, for example, to the rib R, whereas its movable positioning member Sg is effective at the lower wall W2 of the adjustable housing section Ga and can effect an elastic, shift-free deflection of the adjustable housing section Ga and, therefore, of the objective tube Obt1 or, respectively, of the objective tube Obt2.

In order to simplify the graphic illustration, the illumination arrangement has been omitted from FIG. 1 and in FIGS. 2 and 3. The illumination of the semiconductor wafer Hs and of the mask M (cf. FIG. 1) occurs in the manner of a microscope illumination, particularly according to Köhler's illumination principle wherein the subject is illuminated by parallel rays. The introduction of the light into the apparatus thereby occurs via light wave guides in order to avoid the development of heat within the apparatus and a corresponding thermal warping.

The adjustment of the objectives Ob1 and Ob2 (cf. FIG. 1) shown in FIGS. 2 and 3 via the adjustable housing section Ga enables an absolute play-free adjustment having a positioning reproducibility of $\pm 0.01$ $\mu$m given a statistical reliability of 95%. Moreover, the illustrated apparatus enables an identification of the relative position of the mask M and the semiconductor wafer Hs with extremely slight measuring incertainties of 0.01 $\mu$m and, respectively, $\pm 1$s.

Given the apparatus illustrated in FIGS. 2 and 3, only the objectives Ob1 and Ob2 (cf. FIG. 1) are adjusted with the adjustable housing section Ga. However, it can also be advantageous to displace all optical components of the apparatus, including the TV cameras TVK1 and TVK2, with the displaceable housing section Ga. In this case, the adjustment of the overall apparatus becomes more simple, since the direction of movement of the objectives Ob1 and Ob2 (cf. FIG.1) need not proceed exactly parallel to the optical axis oA1 or, respectively, oA2.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for imaging first and second subjects, located in respective first and second spaced object planes, comprising:
   a housing including a stationary section, a displaceable section, and resilient connections joining said stationary and displaceable sections;
   optical sensor means carried by said stationary sections;
   at least one objective lens carried by said displaceable section and movable therewith relative to the first and second object planes; and
   a positioning drive connected to and operable to displace said displaceable section.

2. The arrangement of claim 1, wherein:
   said resilient connections comprise pairs of resilient connections on opposite sides of said displaceable section.

3. The arrangement of claim 1, wherein:
   said housing comprises at least one wall connecting said stationary and displaceable sections; and
   each of said resilient connections comprise transverse grooves in said at least one wall defining a reduced wall thickness for flexure.

4. The arrangement of claim 1, wherein:
   said housing comprises a pair of walls connecting said stationary and displaceable sections; and
   each of said resilient connections comprises transverse grooves in each of said walls defining a reduced wall thicknesses for flexure.

5. The arrangement of claim 1, wherein:
   said housing comprises at least one wall connecting said stationary and displaceable sections; and
   each of said resilient connections comprises transverse grooves in opposite sides of said at least one wall defining a reduced wall thickness for flexure.

6. The arrangement of claim 1, wherein:
   said housing comprises at least one wall connecting said stationary and displaceable sections; and
   each of said resilient connections comprises hemispherical cross section transverse grooves in said at least one wall defining a reduced wall thickness for flexure.

7. The arrangement of claim 1, wherein:
   said housing comprises a body and slots in said body extending between respective ones of said resilient connections and separating said stationary and displaceable housing sections.

8. The arrangement of claim 1, wherein:
   said positioning drive is carried by said stationary section.

9. The arrangement of claim 8, wherein:
   said displaceable section comprises wall means defining an opening therethrough; and
   said positioning drive is mounted to said stationary section within said opening and connected to said wall means.

10. The arrangement of claim 9, and further comprising:
a rib projecting from said stationary section into said opening and mounting said positioning drive.

11. The arrangement of claim 1, wherein:
said positioning drive is a piezo positioning drive.

12. The arrangement of claim 1, and further comprising:
a barrel lens carried by said stationary section and generally aligned with said objective lens,
said objective lens comprising an infinite image distance.

13. An arrangement for imaging first and second subjects, located in respective first and second spaced object planes, comprising:
a housing including a stationary section, a displaceable section and resilient connections joining said stationary and displaceable sections;
optical sensing means carried by said stationary sections;
first and second objective lenses mounted spaced apart on said displaceable section to define respective first and second spatially separated fields of view along respective first and second optical axes and movable with said displaceable section relative to said first and second object planes;
first and second stationary optical sensors constituting said optical sensing means for receiving image information from the respective first and second objective lenses; and
a positioning drive connected to said displaceable section centrally between said first and second objective lenses, and operable to move said displaceable section toward and away from said object planes.

14. An arrangement for imaging first and second subjects, located in respective first and second spaced planes, onto optical sensing means, comprising:
a housing including a stationary section, a displaceable section, a pair of walls connecting said stationary and displaceable sections, and a plurality of resilient connections in each of said walls on opposite sides of said displaceable sections, each of said resilient connections comprising at least one pair of grooves in opposite sides of the respective wall defining a resilient wall section of reduced wall thickness;
said displaceable section including a pair of spaced members interconnecting said pair of walls and therewith defining a first opening through said displaceable section, a pair of projections extending from one of said walls and a cross member connecting said projections to define a second opening;
first and second objective lenses mounted spaced apart on said cross member to provide first and second separated fields of view along respective first and second optical axes and movable with said displaceable section relative to said object planes, each of said lenses having an infinite image distance;
first and second barrel lenses respectively aligned with said first and second objective lenses, and barrel lens mounting means carrying said barrel lenses and mounted to said stationary section within said second opening;
first and second optical sensors mounted on said stationary section for receiving image information from said first and second objective and barrel lenses; and
a positioning drive mounted to said stationary section within said first opening and connected to said one wall centrally between said optical axes for displacing said displaceable section.

15. The arrangement of claim 14, and further comprising:
first and second optical systems each interposed between a respective barrel lens and respective optical sensor.

16. The arrangement of claim 15, wherein:
each of said optical systems comprises an ocular lens and a beam path charging element.

17. The arrangement of claim 16, wherein:
said beam path charging element comprises a mirror.

18. The arrangement of claim 14, and further comprising:
a rib projecting from said stationary section into said first opening and mounting said positioning drive.

19. The arrangement of claim 14, wherein:
said housing comprises a body including said stationary and displaceable sections integrally formed therein;
a plurality of cavities in said body on opposite sides of said displaceable section; and
said optical sensors mounted in respective ones of said cavities.

* * * * *